United States Patent [19]

Ishiyama et al.

[11] 4,038,615
[45] July 26, 1977

[54] ELASTIC SURFACE WAVE DEVICE

[75] Inventors: Hideki Ishiyama; Atushi Inoue; Hideharu Ieki, all of Nagaokakyo, Japan

[73] Assignee: Murata Manufacturing Co., Ltd., Nagaokakyo, Japan

[21] Appl. No.: 663,764

[22] Filed: Mar. 4, 1976

[30] Foreign Application Priority Data

| Mar. 4, 1975 | Japan | 50-26858 |
| Mar. 4, 1975 | Japan | 50-26859 |
| Sept. 4, 1975 | Japan | 50-107658 |
| Nov. 7, 1975 | Japan | 50-152144 |

[51] Int. Cl.² .............. H03H 9/04; H03H 9/26; H03H 9/32; H01L 41/18
[52] U.S. Cl. ............................ 333/72; 310/9.5; 310/9.8; 333/30 R
[58] Field of Search .............. 333/30 R, 72; 310/8, 310/8.1, 8.2, 9.8, 9.5; 29/25.35

[56] References Cited

U.S. PATENT DOCUMENTS

| 3,464,033 | 8/1969 | Tournois | 333/30 R |
| 3,665,225 | 5/1972 | van der Heuvel et al. | 310/8.1 |
| 3,689,784 | 9/1972 | De Klerk | 310/9.8 |
| 3,760,299 | 9/1973 | Vasile | 333/30 R |
| 3,786,373 | 1/1974 | Schulz et al. | 333/72 X |
| 3,965,444 | 6/1976 | Willingham et al. | 333/30 R |

*Primary Examiner*—Alfred E. Smith
*Assistant Examiner*—Marvin Nussbaum
*Attorney, Agent, or Firm*—Birch, Stewart, Kolasch & Birch

[57] ABSTRACT

An elastic surface wave device comprises a substrate of dielectric material, a thin layer of piezoelectric material, a plurality of electrodes and a thin layer of dielectric material. The piezoelectric layer is spaced from the electrodes with the thin dielectric layer formed therebetween and is so arranged as to facilitate the employment of a known photo-etching method to form the electrodes.

4 Claims, 8 Drawing Figures

ELASTIC SURFACE WAVE DEVICE

The present invention relates to an elastic surface wave device and, more particularly, to an elastic surface wave transducer.

There has been known an elastic surface wave transducer which comprises a substrate, made of fused quartz, etc., a thin layer of piezoelectric material formed on one of the opposed surfaces of the substrate and at least one pair of interleaved-comb-type electrodes formed on said surface of said substrate and sandwiched between said substrate and said thin layer of piezoelectric material. Each of the electrodes has a common lead-in portion and a plurality of electrode ribs coupled to said lead-in portion in such a manner as to represent a substantially comb-like pattern and extending in parallel and equally spaced relation to each other. On the surface of the substrate, the electrode ribs of one electrode are made to extend in equally spaced relation into respective spaces each defined between adjacent two members of the electrode ribs of the other electrode.

In the conventional surface wave transducer of the construction described above, formation of the electrodes is carried out by means of metal evaporation coating with the use of a masking member having a shaped opening similar in shape to the pattern of the lead-in portion and electrode ribs. This is because a photoetching technique cannot be applied to form the electrodes on the surface of the substrate, or otherwise a piezoelectric material constituting the substrate wil be adversely affected by chemicals employed in the practice of the photo-etching technique.

While the photo-etching method cannot be employed in the formation of the electrodes on the substrate according to the prior art, the vacuum evaportion plating or coating method is, as compared with the photo-etching method, disadvantageous in that the resultant electrodes on the substrate can hardly be formed close to the designed dimensions with no difficulty and, therefore, ultimate manufacture of the surface wave transducer having a high operating frequency cannot be achieved.

Furthermore, the thin layer of piezoelectric material in the conventional surface wave transducer tends to be corroded in contact with corrosive gases, such as a sulfurous acid gas, present in the atmosphere, which results in reduction in durabililty of the surface wave transducer.

Accordingly, the present invention has for its essential object to provide an improved elastic surface wave transducer which can advantageously be manufactured by any known photo-etching method with the electrodes formed close to the designed dimensions, thereby substantially eliminating the disadvantages and inconveniences inherent in the conventional transducer of a similar kind.

Another important object of the present invention is to provide an improved elastic surface wave transducer which can, therefore, be manufactured so as to give a high frequency operating characteristic.

According to the present invention, an essential feature resides in the employment of a thin layer of dielectric material, such as $Al_2O_3$, SiO or $SiO_2$.

These and other objects and features of the present invention will become apparent from the following description taken in conjunction with preferred embodiments thereof with reference to the accompanying drawings, in which.

Figure 4:
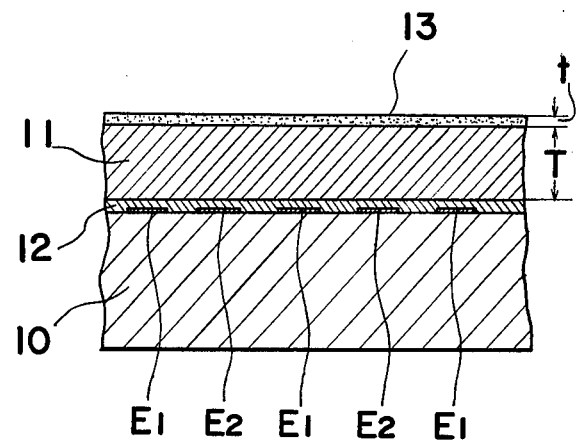
FIG. 4 is a view similar to FIG. 1, but according to a fourth embodiment of the present invention.
Figure 6:
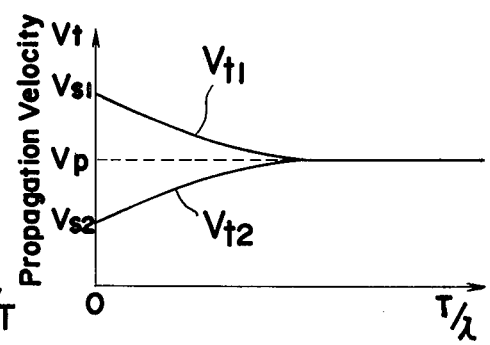
Figure 7:
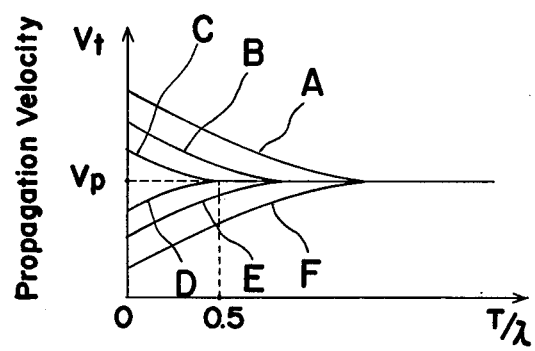
Figure 8:
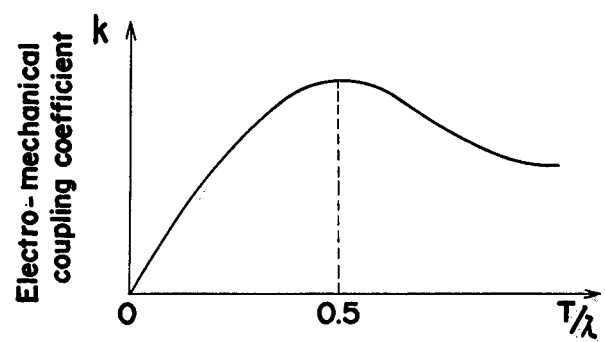

FIG. 6 is a graph showing a relationship between a ratio of the wavelength relative to the thickness of a layer of piezoelectric material and the velocity of propagation of surface waves, which is attained when the velocity of propagation of the surfaces transmitted through the layer of piezoelectric material and the velocity of propagation of the surface waves transmitted through a substrate are fixed;

FIG. 7 is a graph similar to that shown in FIG. 4, but illustrating the relationship which is attained when the velocity of propagation of the surface waves transmitted through the layer of piezoelectric material is varied; and FIG. 8 is a graph illustrating a relationship between the electro-mechanical coupling coefficient and a ratio of the wavelength relative to the thickness of the layer of piezoelectric material.

Before the description of the present invention proceeds, it is to be noted that like parts are designated by like reference numerals throughout the accompanying drawings.

Figure 1:
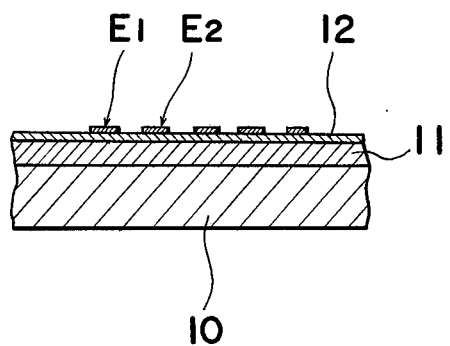
FIG. 1 is a sectional view of a portion of an elastic surface wave transducer according to a first embodiment of the present invention.

Referring to FIG. 1, an elastic surface wave transducer constructed according to the teachings of the present invention comprises a substrate 10, made of dielectric material having one surface mounted rigidly thereon a thin piezoelectric layer 11. The piezoelectric layer 11 is made of a piezoelectric material, such as ZnO or CdS, having such a property as to be easily affected adversely when in contact with one or both of acidic and alkaline chemicals. Rigidly mounted on the other surface of the piezoelectric layer 11 opposed to the substrate 10 is a thin dielectric layer 12 which is made of dielectric material, such as $Al_2O_3$, SiO and $SiO_2$, having a dielectric constant substantially equal to or smaller than that of the piezoelectric material for the layer 11.

The surface wave transducer further comprises, in the instance as shown, two spaced pairs of electrodes; one pair serving as an input electrode assembly and the other pair serving as an output electrode assembly. However, since the electrodes of these pairs are formed in the same plane, it is to be understood that, in FIG. 1 and also in the other accompanying drawings, particularly, in FIGS. 2 to 4, only one of the pairs of the electrodes is illustrated for the sake of brevity and the electrodes of the illustrated pair are generally indicated by El and E2, respectively. It is also to be noted that, since the construction and arrangement of each of the electrodes E1 and E2 is well known to those skilled in the art, the details thereof are herein omitted for the sake of brevity.

The electrodes E1 and E2 are formed on one of the opposed surfaces of the dielectric layer 12 remote from the piezoelectric layer 11 by a known photo-etching method or an equivalent thereof.

As hereinbefore described, the dielectric constant of the dielectric material for the thin layer 12 is substantially equal to or smaller than that of the piezoelectric material for the thin layer 11. If the dielectric constant of the dielectric layer 12 is excessively great, a portion of the electromagnetic flux which is developed between any one of electrode ribs of the electrode E1 and an adjacent one of electrode ribs of the electrode E2 is directed toward the dielectric layer 12 with reduction in the intensity of the electromagnetic flux flowing across the piezoelectric layer 11, resulting in reduction in characteristic of the ultimate surface wave transducer.

The thickness of the dielectric layer 12 must be within the range of 50A to 10μ, preferably within the range of 100 to 1,000A and more preferably within the range of 500 to 1,000A. If the thickness of the dielectric layer 12 is greater than the uppermost limit of 10μ, reduction in charactistic of the transducer will occur by the same reason as described above in connection with the dielectric constant of the dielectric layer 12. On the other hand, if the thickness thereof is smaller than the lowermost limit of 50A, the piezoelectric layer 11 will adversely be affected by chemicals through the dielectric layer 12, which chemicals are employed in the practice of the photo-etching method to form the electrodes E1 and E2 on the dielectric layer 12.

Figure 2:
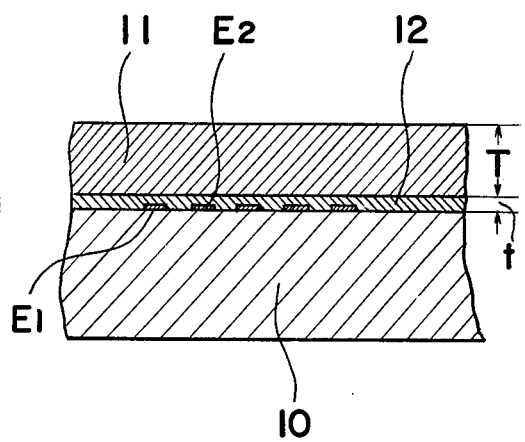
FIG. 2 is a view similar to FIG. 1, but according to a second embodiment of the present invention.
Figure 3:
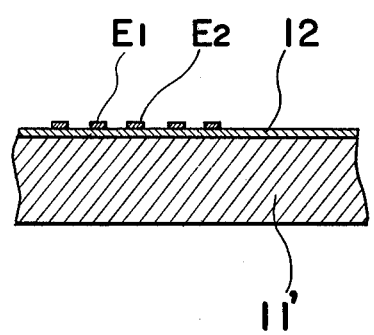
FIG. 3 is a view similar to FIG. 2, but according to a third embodiment of the present invention.

In the embodiment shown in FIG. 2, the dielectric layer 12 with the electrodes E1 and E2 formed thereon is rigidly mounted on the substrate 10 with said electrodes E1 and E2 sandwiched between the layer 12 and the substrate 10 while the piezoelectric layer 11 is rigidly mounted on the surface of the dielectric layer 12 remote from the substrate 10. The transducer of the construction of FIG. 2 only differs from the transducer of the construction of FIG. 1 in the position of either the substrate 10 or a combination of the layers 11 and 12 and electrodes E1 and E2 relative to the other.

While during the manufacture of the transducer of the construction shown in FIG. 1, the layer 11 is first formed on the substrate 10 by any known method, such as by means of vacuum evaporation plating or spattering technique, and the layer 12 is subsequently formed on the resultant layer 11 by any known method, such as by means of vacuum evaporation plating or spattering technique, prior to the formation of the electrodes E1 and E2 on said layer 12 by means of the photo-etching method, the manufacture of the transducer of the construction shown in FIG. 2 is carried out by first forming the electrodes E1 and E2 on the surface of the substrate 10, then applying the layer 12 by the vacuum evaportion plating or spattering method onto the substrate 10 and the electrodes E1 and E2 and finally applying the layer 11 by the vacuum evaporation plating or spattering method onto the resultant layer 12.

Dielectric material for the layer 12 shown in FIG. 2 is identical to that for the layer 12 shown in FIG. 1, but the one having a specific electric resistance of about $10^{14}$ Ω/cm is preferred for the layer 12 of FIG. 2.

The construction of FIG. 2 is, if the requirements which will be described later are satisfied, advantageous in that the resistance to D.C. breakdown voltage of the transducer can be improved. To this end, the thickness of the layer 12 in the construction of FIG. 1, is to be selected so as to satisfy the following formula:

$$0.1 \mu m < t < 1/5 \cdot T$$

wherein $t$ and $T$ represents the thickness of the dielectric layer 2 and the thickness of the piezoelectric layer 11, respectively.

If the thickness $t$ is smaller than the lowermost limit of 0.1μm, formation of pin-holes in the dielectric layer 12 is likely to occur which results in a decrease in voltage withstanding characteristics of the ultimate transducer of the construction of FIG. 2. On the other hand, if the thickness $t$ is greater than one-fifth of the thickness T, the voltage withstanding characteristic of the ultimate transducer will adversely be affected.

In the construction of FIG. 2, assuming that the foregoing requirements have been satisfied, since the specific electric resistance of the piezoelectric layer 11 is so much lower than that of the dielectric layer 12, that the piezoelectric layer 11 can be considered an electro-conductive body relative to the dielectric layer 12, a major portion of the D.C. voltage which is applied to the electrodes is loaded on the dielectric layer 12 and, therefore, no leakage current will substantially flow through the piezoelectric layer 11.

It is to be noted that, in any of the foregoing embodiments, the substrate 10 has been described as independent and separate of the piezoelectric layer 11. However, if the piezoelectric layer 11 shown in FIG. 1 has a great thickness and, therefore, a sufficient mechanical strength, the piezoelectric layer can satisfactorily and effectively serve as a substrate, such as indicated by 11' in FIG. 3.

The surface wave transducer shown in FIG. 4 is substantially identical in construction to that shown in FIG. 2 except for an extra thin layer of dielectric material, indicated by 13, which is formed on the opposite surface of the piezoelectric layer 11 from the surface contacting the substrate 10 and electrodes E1 and E2. The extra dielectric layer 13 is employed for the purpose of adjustment of the center frequency of the transducer.

Heretofore, adjustment of the center frequency given by the surface wave transducer has been carried out during the manufacture of such transducer in such a manner as to render the pattern of the electrodes and/or the thickness of the electrodes to strictly comply with the designed pattern and/or thickness. However, it has been often experienced that variations in center frequency are found in surface wave transducers of the same construction at the time of completion of manufacture thereof.

According to the present invention, even after the manufacture of transducers of the same construction has completed, the fine adjustment of the center frequency to a predetermined value can readily be achieved merely by forming the dielectric layer 13 on the opposite surface of the piezoelectric layer 11 from the layer 12 adjacent the substrate 10. However, it is to be noted that the velocity of propagation of surface waves among the electrodes varies depending upon a ratio of the thickness of the dielectric layer 13 relative to the thickness of the piezoelectric layer 11 and, therefore, by varying the thickness of the dielectric layer 13, the fine adjustment of the center frequency to the predetermined value can be achieved.

Figure 5:
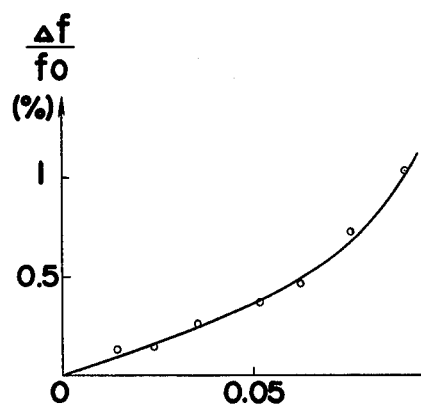
FIG. 5 is a graph showing variation in operating frequency characteristic of the surface wave transducer shown in FIG. 4.

Particularly in the case where the substrate 10, the piezoelectic layer 11 and the dielectric layer 13 are made of glass, ZnO and SiO, respectively, variation of the center frequency relative to the ratio of the thickness $t$ of the dielectric layer 13 to the thickness T of the piezoelectric layer 11, that is, $t/T$, has been found to substantially follow the curve shown in the graph of FIG. 5.

With reference to FIG. 5, it is clear that the curve is represented by the following formula:

$$(\Delta f/f_0) = (f' - f_0)/f_0$$

wherein $f_0$ represents the center frequency given prior to the mounting or formation of the dielectric layer 13 and $f'$ represents the center frequency given after the mounting or formation of the dielectric layer 13. Accordingly, when the ratio $t/T$ is less than 0.1, 1% adjustment of the center frequency can be available. On the other hand, when the ratio $t/T$ becomes 0.5, the loss of transmission of the elastic surface waves will increase. In view of the foregoing, only when the ratio $t/T$ is within the range of more than zero to less than 0.5, that is, $0 < t/T < 0.5$, an effective adjustment of the center frequency ultimately given by the elastic surface wave transducer according to the present invention can readily be achieved.

In the conventional elastic surface wave transducer of the construction as hereinbefore described, since the electrodes are formed on the substrate by means of the vacuum evaporation plating or spattering method, the resultant electrodes tend to vary in thickness. Therefore, the tranducers of the same construction manufactured one at a time cannot be uniformly maintained with respect to performance, particularly the center frequency given thereby and a delay time characteristic thereof.

This can be overcome by, as will subsequently be described with reference to FIGS. 6 to 8, an elastic surface wave transducer which comprises a substrate of dielectric material, a thin layer of piezoelectric material and electrodes formed on the substrate by the known photo-etching method and held in between the substrate and the piezoelectric layer. The construction so far described is substantially similar to that shown in FIG. 2 but with the dielectric layer 12 to FIG. 2 omitted.

However, the tranducer according to the present invention, which will be discussed with reference to FIGS. 6 to 8, is designed such that a ratio of the velocity of propagation of elastic surface waves transmitted through the substrate, designated by $V_s$, relative to the velocity of propagation of elastic surface waves transmitted through the piezoelectric layer, designated by $V_p$, that is $V_s/V_p$, is selected to be within the range of more than 0.85 to less than 1.15.

In the conventional transducer of the construction wherein the electrodes are held between the substrate and the piezoelectric layer, such characteristics as shown in the graph of FIG. 6 has been found when the velocity $V_t$ of elastic surface waves propagating within the transducer having the piezoelectric layer of the thickness T is measured. The graph of FIG. 6, $V_{t1}$ represents a variation of the velocity $V_t$ which is attained when the velocity of propagation of the elastic surface wave transmitted through the substrate is of a value $V_{s1}$ while the velocity of propagation of the elastic surface waves transmitted through the piezoelectric layer is of a value $V_p$. On the other hand, $V_{t2}$ represents a variation of the velocity $V_t$ which is attained when the velocity of propagation of the elastic surface wave transmitted through the substrate is of a value $V_{s2}$ while the velocity of propagation of the elastic surface wave transmitted through the piezoelectric layer is of a value $V_p$. $\lambda$ represents the wavelength of the elastic surface waves.

When the velocity $V_s$ of propagation of the elastic surface waves transmitted through the substrate shown in the graph of FIG. 6 is varied, the graph of FIG. 7 is obtained. In the graph of FIG. 7, curves A, B, C, D, E and F are obtained when the ratio $V_s/V_p$ is 1.45, 1.30, 1.15, 0.85, 0.70 and 0.55, respectively.

The result of measurement of the electro-mechanical coupling coefficient $k$ with respect to the thickness T of the piezoelectric layer, is illustrated in the graph of FIG. 8. With reference to the graph of FIG. 8, the coefficient $k$ attains a maximum value when a ratio $T/\lambda$ is about 0.5. Accordingly, as can be understood from the graphs of FIGS. 6 and 7, it is clear that, when the ratio $V_s/V_p$ is within the range of more than 0.85 to less than 1.15, that is, when $0.85 < V_s/V_p < 1.15$, the velocity $V_t$ becomes flat with the ratio $T/\lambda$ being about 0.5. In other words, even though thickness $t$ of the piezoelectric layer varies to an extent that the ratio $V_s/V_p$ falls within the above described range, the velocity $V_t$ will not be affected adversely and, also, the center frequency and the delay time will not be affected adversely.

The foregoing description made with reference to FIGS. 6 to 8 can equally be applicable to the transducer wherein the electrodes are formed on the piezoelectric layer which is in turn formed on the substrate with said electrodes spaced from said substrate through said piezoelectric layer.

The present invention having fully been described, it is to be noted that the following materials have a dielectric constant as set forth below

| Material | Dielectric Constant |
|----------|---------------------|
| ZnO | 8.3 to 11.1 |
| $Al_2O_3$ | 9.34 to 11.6 |
| $SiO_2$ | 4.5 to 4.6 |

Although the present invention has fully been described in conjunction with the preferred embodiments thereof, it is to be noted that various changes and modifications are apparent to those skilled in the art and, therefore, such changes and modifications are to be understood as included within the true scope of the present invention unless they depart therefrom.

What is claim is:

1. An elastic surface wave device which comprises;
   a substrate made of dielectric material;
   a thin layer made of piezoelectric material formed on said substrate; and
   at least one pair of electrodes formed between said substrate and thin layer;
   the ratio between the velocity of propagation of the elastic surface waves transmitted through said substrate to the velocity of propagation of the elastic surface waves transmitted through said thin layer being within the range of more than 0.85 to less than 1.15.

2. An elastic surface wave device which comprises;
   a substrate made of dielectric material;
   a first thin layer made of dielectric material formed on said substrate;
   a second thin layer made of piezoelectric material formed on said first thin layer; and
   at least one pair of electrodes formed between said substrate and said first thin layer;
   the ratio between the velocity of propagation of the elastic surface waves transmitted through said substrate to the velocity of propagation of the elastic surface waves transmitted through said second thin layer being within the range of more than 0.85 to less than 1.15, said first thin layer having a predetermined high electric resistance.

3. An elastic surface wave tranducer which comprises;

a substrate made of dielectric material;

a first thin layer made of piezoelectric material formed on said substrate;

means for adjusting the center frequency of said surface wave transducer including a second thin layer made of dielectric material formed on said first thin layer, the center frequency being adjustable as a function of the thickness of said second thin layer; and at least one pair of electrodes formed between said substrate and said first thin layer;

the ratio between the velocity of propagation of the elastic surface waves transmitted through said substrate to the velocity of propagation of the elastic surface waves transmitted through said first layer being within the range of more than 0.85 to less than 1.15.

4. An elastic surface tranducer which comprises;

a substrate made of dielectric material;

a first thin layer made of dielectric material formed on said substrate, said first thin layer having a predetermined high electric resistance;

a second thin layer made of piezoelectric material formed on said first thin layer;

means for adjusting the center frequency of said surface wave transducer including, a third thin layer made of dielectric material formed on the opposite surface of said second thin layer from said first thin layer, the center frequency being adjustable as a function of the thickness of said third thin layer; and at least one pair of electrodes formed between said substrate and said first thin layer;

the ratio between the velocity of propagation of the elastic surface waves transmitted through said substrate to the velocity of propagation of the elastic surface waves transmitted through said second thin layer being within the range of more than 0.85 to less than 1.15.

* * * * *